United States Patent [19]
Pezant

[11] Patent Number: 5,302,818
[45] Date of Patent: Apr. 12, 1994

[54] IMAGE DETECTOR WITH REDUCED PARASITIC LIGHT

[75] Inventor: Christian Pezant, Villecresnes, France

[73] Assignee: U.S. Philips Corporation, New York, N.Y.

[21] Appl. No.: 968,609

[22] Filed: Oct. 29, 1992

[30] Foreign Application Priority Data

Oct. 30, 1991 [FR] France .................. 91 13404

[51] Int. Cl.⁵ .............................................. H01J 3/14
[52] U.S. Cl. ................................. 250/216; 257/434
[58] Field of Search ................. 250/214.1, 216, 239; 257/432, 433, 434

[56] References Cited

U.S. PATENT DOCUMENTS 4,636,631  1/1987  Carpentier et al. ............ 250/216
5,149,958  9/1992  Hallenbeck et al. ........... 250/216

*Primary Examiner*—David C. Nelms
*Attorney, Agent, or Firm*—Steven R. Biren

[57] ABSTRACT

An image detector includes a surface sensitive to photon radiation which is protected from the external environment by a transport window with an internal diopter and an external diopter which is integral with a housing and is placed in front of the sensitive surface. In order to eliminate the phenomenum known as "blooming" due to parasitic reflections causes by intense radiation, the window is formed by a transparent, nondiffusing medium which attenuates photon radiation, with the internal diopter of the window being at a distance from the sensitive surface which is smaller than or at most equal to several times the resolution distance of the detector. Additionally, the external diopter is sufficiently far removed from the sensitive surface such that the first reflection of the radiation coming from a source of maximum radiation will have a level, on the sensitive surface, which is lower than that of the direct radiation coming from a source of minimum radiation which is to be detected.

8 Claims, 1 Drawing Sheet

IMAGE DETECTOR WITH REDUCED PARASITIC LIGHT

BACKGROUND OF THE INVENTION

The invention relates to an image detector comprising a surface sensitive to photon radiation and protected from the external environment by a transparent window which is integral with a housing and is placed, with an internal diopter and an external diopter, in front of the said sensitive surface, the latter having a surface quality capable of generating radiation reflections over angles which can amount to several dozens of degrees relative to the direction of mirrored reflection on the said surface.

The invention relates particularly to earth sensors and more particularly to earth sensors having a matrix of photosensitive elements with charge transport (CCD matrix) for geostationary satellites.

Image detectors may be classified into two families: those having vacuum tubes whose sensitive surface exposed to photon radiation is a photocathode and those having semiconductor units organized into strips or into a matrix of image elements (or pixels). In most cases, the photosensitive surface of these detectors requires protection against pollution or against degradation caused by the external environment surrounding the detector, whether this relates to dust in the earth's atmosphere or the components of this atmosphere themselves. This protection consists of a window (or porthole) arranged in an impermeable manner in front of the sensitive surface and transparent to the photon radiation to which the relevant detector is sensitive. The window is formed by a glass of optical quality having an internal diopter and an external diopter. The contrast of the image to be analyzed may be impaired in the presence of a source of strong brightness in the field of vision owing to multiple reflections generated, starting from the sensitive surface itself, by secondary parasitic reflections on the two diopters of the protective window. When points or spots of very strong luminance against a weakly illuminated background are observed, these parasitic reflections generate halos on the photosensitive surface whose levels may be much higher than that of the observed scene on earth, or, in space, than any other light source of lesser strength which one wants to observe and which thus constitutes the useful signal, but which is then drowned in the noise. A typical case in which this technical problem arises is when the image detector is a sensor of the earth's contour on board a geostationary satellite and is formed by a CCD matrix for a radiation range comprising the entire visible radiation and the adjoining infrared. However, the earth must be permanently monitored by the detector for a nominal operation of the latter, while the orbit of the satellite is such that during several months of the year, around each equinox, the sun is in the field of the detector for several hours around midnight local time during each revolution of 24 hours. In this illumination situation the luminescence of the sun is approximately $10^6$ to $10^7$ times stronger than that of the earth's contour. When no special measures are taken, the image of the luminous signal coming from the sun and deflected by the atmosphere around the earth would disappear in the matrix in the parasitic light coming directly from the sun and reflected first by the matrix itself and then by the two diopters of the protective window.

The matrix CCD TH 7864 from Thompson-CSF could form a good image detector suitable for the exact application cited as the last one above, provided it were possible to dispense with the protective window which closes the housing. It is not possible, however, to do away with this window which has a mainly protective function, while an inert gas such as nitrogen, for example, fills the volume confined between the window and the matrix. The known TH 7864 matrix referred to above comprises a housing to the bottom of which the silicon slice forming the actual detector is glued, which housing is provided with rims surrounding the slice and defining a surface which lies in a plane situated at a distance of 0.84 mm above the sensitive surface of the detector. A window of optical glass of 0.9 mm thickness is glued against this surface, perfectly transparent to visible light. In these conditions, the two parasitic halos generated around the image of the sun on the matrix by the direct reflection of the sunlight on the matrix and subsequently on the two diopters occupy diameters of the order of 100 pixels and 200 pixels, respectively. Supposing that the detector is to cover a field greater than the apparent diameter of the earth, and that the diameter of the sun is of the order of 35 times smaller than that of the earth viewed from a geostionary orbit, the direct image of the sun has a typical diameter of 6 pixels and that of the earth of 200 pixels. Since the detection of the earth must be assured even when the sun is close to it or on its edge, the image of the earth which one wants to measure is to a major extent or completely masked by each of the two parasitic halos.

Devices for reducing blooming effects in image detectors are known. A first measure to achieve this object is to provide the objective which is placed in front of the detector with photochromic lenses. When the detector is a vacuum tube, another solution is to interpose a strip of microchannels in the electron path. When the photocathode of the tube receives a strong, point-shaped illumination, the local saturation properties of the strip of microchannels limit the blooming while still rendering possible the observation of the remaining landscape.

SUMMARY OF THE INVENTION

The invention has for its object to resolve a technical problem which is more limited and more precise than the one indicated in the preceding paragraph, i.e. to eliminate the blooming owing to single parasitic reflections caused by a transparent window placed immediately in front of the sensitive surface of an image detector in the case of an (almost) point-like source of intense radiation.

This problem is resolved and the disadvantages of the known art are reduced or eliminated by the fact that the image detector defined above is characterized in that the said window which forms part of the detector is formed by a transparent, non-diffusing medium which attenuates the said photon radiation, in that the said internal diopter is at a distance from the said sensitive surface which is smaller than or at most equal to several times the resolution distance of the detector, and in that the external diopter is sufficiently far removed from the said sensitive surface for the first reflection of the radiation coming from the source of maximum radiation to have a level, on the said sensitive surface, which is lower than that of the direct radiation coming from the source of minimum radiation which is to be detected.

The reduction of the two parasitic halos to a minimum is thus achieved by measures which are substantially different for the two diopters.

As for the internal diopter, by making it come closer, for example, from 1 mm to 20 μm, so a ratio of the order of 50, the diameter of the closest halo is also reduced by the same ratio. As for the external diopter, on the other hand, the object is to render the halo as diffuse as possible by using at the same time the dispersion effect on the sensitive surface of the matrix and an attenuation effect by obscuring the transparent medium, utilizing advantageously the double path travelled in this medium.

A preferred embodiment of an image detector according to the invention is formed by a contour sensor comprising a surface sensitive to visible radiation and arranged in the form of strips or a matrix of the CCD type or CID type, which detector is incorporated in a housing provided with the said transparent window placed in front of the sensitive surface. This embodiment is in addition characterized in that at least that diopter which marks the separation between the said transparent window and the external environment comprises thin anti-reflection interference layers.

It is advantageous to provide anti-reflection layers on both diopters of the window, internal and external. The ratio of luminance to reflected light for each diopter is reduced by this from a few percents to a few tenths of percents, so an attenuation of parasitic reflection luminance of the order of 10.

BRIEF DESCRIPTION OF THE DRAWING

The following description with reference to the annexed drawing is given by way of example and will show clearly how the invention may be realized. In the drawing.

In the Figures, the same reference numerals refer to the same elements having the same functions.

DESCRIPTION OF THE PREFERRED EMBODIMENTS

Figure 1:
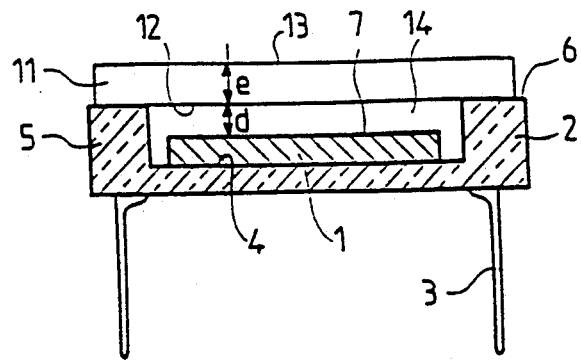
FIG. 1 shows in cross-section on a scale of 5 to 1 an image detector with CCD matrix according to the prior art.

FIG. 1 shows on a scale of approximately 5 to 1 a CCD matrix from Thompson-CSF, TH 7864.

The photodetector matrix 1 of 576×550 pixels is encapsulated in a housing 2 of electrically insulating material with which contact pins 3 of the matrix are integrated. The silicon slice 1 is glued to the bottom 4 of the housing 2, the latter being provided with rims 5 which surround the matrix. The frontal surface 6 of the rims 5 extends in a plane lying at a distance d (d=840 μm) in front of the photosensitive surface 7 of the matrix 1. A transparent window 11 is glued to this surface 6. The window 11 is made of an optical material which is fully transparent to incident photons, is non-diffusing and non-charged and has a thickness e=900 μm; it comprises two diopters, an internal diopter 12 and an external diopter 13. Let it be assumed for the following description, to fix the ideas, that the incident radiation is formed by visible light, and the material of the window is glass. The free volume enclosed between the window 11 and the housing 2 is filled with nitrogen at atmospheric pressure. The surface 7 of the matrix has a slight relief at a microscopic level because of the consecutive etching treatments carried out with different photo-etching masks necessary for forming the desired pixel configuration. The result is that an incident beam of photons hitting the surface 7 perpendicularly is reflected for approximately 10% according to a truncated cone whose half-angle at the top is of the order of a few tens of degrees (not shown). This parasitic reflected radiation in its turn is reflected for a few percents by the diopters 12 and 13 (typically 4%). This results in two halos on the photosensitive surface 7 around the center of incident radiation, a small halo having a radius r1 of the order of 2d and a wide halo of a radius r2 of the order of 2(d+e). It can be demonstrated that, given the values of d and e indicated above, the illumination ratios between the incident radiation and parasitic reflected radiation are, for the first halo, of the order of a few times $10^{-5}$, and for the second halo of the order of $10^{-6}$. The image detector of FIG. 1 was tested and is quite suitable for maximum contrast values of the order of $10^3$ to $10^4$, which is sufficient for the majority of applications.

However, if the detector is to be used as an earth sensor using visible light, luminous contrasts higher than $10^7$ are encountered, resulting from the presence of the solar disc in the field close to the contour of the earth, around midnight, and the relative dimensions between the observed details and the dimension of each pixel (the contour having a thickness which is 3 to 5 times smaller than the resolution of the detector), i.e. such contrasts that the useful signals are drowned in each of the two parasitic halos described above. According to the invention, the detector of FIG. 1 is modified as shown in FIG. 2 in order to eliminate the two parasitic halos in the case of luminous contrasts in excess of $10^7$.

Figure 2:
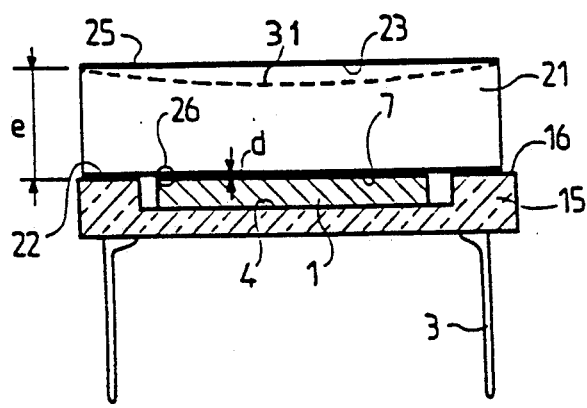
FIG. 2 shows in cross-section on a scale of 5 to 1 a detector with CCD matrix according to the invention.

In FIG. 2, certain design modifications are visible while others are not. The front surface 16 of the rims 15 extends in a plane which is very slightly raised above the photosensitive surface, by a distance d which is of the order of a few microns, typically 10 μm, and in any case at a distance d smaller than the resolution distance which in practice is of the order of the width p of one pixel, which typically lies between 15 and 25 μm. In addition, the thickness of the transparent window 21 is increased to several millimeters so as to cause the external diopter 23 to be farther removed.

Since it is found difficult to decrease sufficiently the luminance of the reduced halo caused by the internal diopter 22, it is so arranged that this halo remains confined very closely to the highly brilliant source, in this case the sun. If the image of the sun on the matrix consists of, for example, a circular spot with radius 3p, the radius of the reduced halo is confined to approximately 5p, so an image of the first parasitic halo of the same order as that of the sun itself, instead of covering the major part or even all of the image of the earth's contour which one wants to detect, of the order of one hundred pixels disposed on a circular arc. As for the halo caused by the external diopter 23, at least two measures are jointly taken to render its luminance lower than that of the earth's contour: its greater distance, if necessary, as stated above, for example equal to 4 mm, and a certain darkening of the transparent medium forming the window 21 whose transmission is brought to a value typically lying between 0.05 and 0.3, for example, equal to 0.1. For this purpose it is possible to use, for example, a glass of neutral density, type NG 4, produced by the German firm of SCHOTT, P.O. Box 2480, D-6500 Mainz. With the numerical values chosen above, the contrast between the luminance of the wide halo in relation to that of the direct image of the sun is reduced to below $10^{-8}$, which constitutes a luminous noise acceptable in relation to the useful signal of the earth's contour. If necessary, it is possible to use thin anti-reflection interference layers 25 on the external diopter 23 which reduces the reflection rate of several hundredths to approximately one thousandth and thus renders it possible to gain an additional ratio 10 in the attenuation of the wide parasitic halo. It is also possible to use anti-reflection layers on the internal diopter 22. With the wide halo it is possible to influence simultaneously the two parameters: thickness e and attenuation of the glass, plus the use of anti-reflection layers for reducing the luminous intensity of the wide halo below a certain threshold, as desired.

Figure 3:
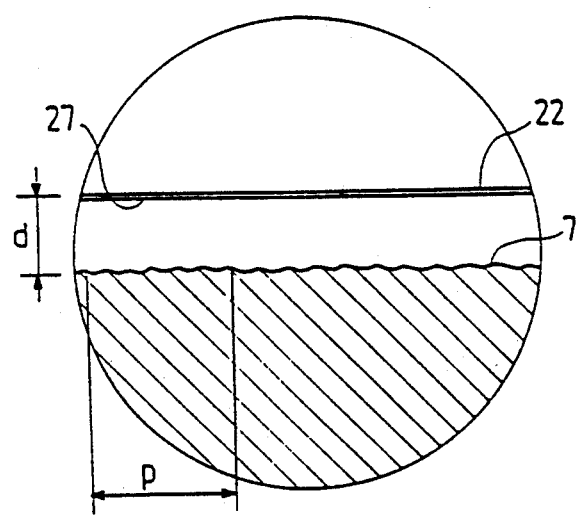
FIG. 3 shows a detail from FIG. 2 on a strongly enlarged scale.

FIG. 3 shows on a strongly enlarged scale the portion 26 surrounded by a circle in FIG. 2. The sensitive surface 7 is shown to have a certain relief which calls up oblique reflections of the light beam, while by contrast the internal diopter 22 is plane. The diopter 22 may be provided with anti-reflection multilayers 27. The distance p is of the order of 20 μm and the interspacing d of the order of 10 μm. This interspacing d may be reduced to almost zero, the two surfaces 7 and 22 being then in contact. It is also possible to join the surfaces 7 and 22 together by means of optical glue (of low diffusion).

Several solutions are possible for the realization of the detector according to FIG. 2. One can use a technology similar to that used for the detector of FIG. 1, but with stricter tolerances for the interspacing d. Instead of being made of, for example, ceramic material, as is the housing 2, the housing 22 is advantageously made of metal, which renders possible the use of machining and assembling techniques which are generally known. It is then necessary to insulate electrically the openings provided in the housing for the passage of the electrical contacts 3. To achieve this, the optional gluing of the matrix 1 to the window 21 may be carried out in two different ways. Either the matrix is first glued to the window and subsequently this sub-assembly is glued to the housing on the prepared surfaces 4 and 16, or the matrix is first glued to the bottom of the housing, as in FIG. 1, after which the window is simultaneously glued to the surface 16 and to the surface 7 of the matrix with different, adapted glues.

Figure 4:
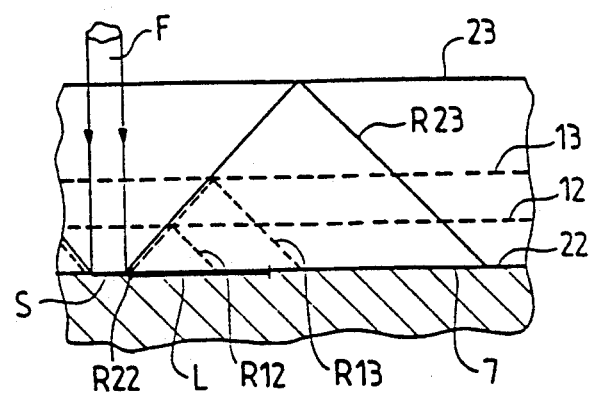
FIG. 4 shows in a cut-away cross-section the front portion of the CCD matrix and the transparent window, in broken lines according to the prior art and in full lines according to the invention.

FIG. 4 renders possible a comparison between the paths of the reflected parasitic beams, in broken lines according to the present art as shown in FIG. 1, and in full lines according to the invention (FIGS. 2 and 3). The outline of the sun S on the surface 7, strongly enlarged, is produced by the incident beam F. The outline L of the earth's contour is approximately 35 times larger than the outline S. The parasitic reflections R12 and R13 cover the major part or the whole of the outline L, each having an intensity stronger than L. By contrast, the outline of the parasitic reflection R22 is almost point-shaped, while that of the parasitic reflection R23 is substantially wider than the outline L, which also renders it so much weaker.

The luminance of the earth's atmosphere varies from 7.5 W/m²×sr with the sun at midday to 0.1 W/m²×sr with the sun at midnight (i.e. eclipsed behind the earth), so a luminance ratio of 75. The attenuation caused by the coloring of the mass of the transparent window according to the invention may be detrimental to the detection of the earth's contour when the sun is obscured behind the earth. An advantageous embodiment of the invention is characterized in that a photochromic glass is used whose transmission in the dark state reaches a value lying between the cited limits of 0.05 and 0.3, while in the clear state the transmission may be in excess of 0.9. A glass which is suitable for this latter embodiment is, for example, a PGD or PGE glass from the firm of Coming Europe, P.O. Box 3, 77210 Avon (France).

Normally, an objective is placed in front of the detector. This objective obviously leads to an image field curvature, i.e. the image is not plane but is formed on a sphere. A means of correcting this fault consists in that a divergent lens is placed immediately in front of the image, which lens should obviously be included in the calculation of the optical formula of the objective. In the present case, the window may perform this function. For this purpose it is sufficient to make the external diopter concave (window thickness smallest in the center, as shown by the broken line 31 in FIG. 2), so that the window acts as a divergent lens. It will be noted that this solution is acceptable in an attenuating medium on the sole condition that the concavity should remain small in relation to the thickness of the window to avoid an excessive variation in transmission over the field.

Generally speaking, detectors, whether they are of the matrix or of the strip type, have a sensitive surface which is surrounded by more or less complicated structures, such as the memory zone, read registers, electronic control and read circuits, etc. These structures comprise portions which may be highly reflecting (aluminum mask of memories, gold-plating of circuits, for example) and thus generate parasitic light. Since the transparent window usually covers these reflecting non-sensitive portions, it is advantageous for resolving this problem of additional parasitic light to deposit or bond an absorbing mask ("black" paint, gold black, or other—not shown) on the internal diopter of the window, which mask defines the useful surface zone of the detector and stops beams which hit on the remainder of the detector surface.

The invention was described above for a highly specific application (earth sensor) of an image detector which itself is specific (CCD matrix); however, it may be applied to other types of image detectors and other applications. For example, the detection matrix may be of the CID type, i.e. electronically addressable. Instead of a matrix, it is also possible to use several detection strips which each comprise a transparent window according to the invention (CCD or photodiode strips). The detector may alliteratively be a vacuum tube with a photoemission cathode, for example, a Vidicon tube. It is also imaginable to use semiconductor matrices which are sensitive to certain infrared radiations. The image detector may be used in space, but also on the ground, notably on the earth, in the presence of the sun or of a powerful light projector.

I claim:

1. An image detector comprising a surface sensitive to photon radiation and protected from the external environment by a transparent window with an internal diopter and an external diopter which is integral with a housing and is placed in front of said sensitive surface, the sensitive surface having a surface quality capable of generating radiation reflections over angles of up to several dozens of degrees relative to the direction of mirrored deflection on said surface, characterized in that said window which forms part of the detector is formed by a transparent, non-diffusing medium which attenuates the photon radiation, in that said internal diopter is at a distance from said sensitive surface which is smaller than or at most equal to about 25 μm, and in that the external diopter is sufficiently far removed from said sensitive surface such that the reflection of the radiation coming from the source of maximum radiation off of said external diopter has a level, on said sensitive surface, which is lower than that of the direct radiation coming from the source of minimum radiation which is to be detected.

2. An image detector as claimed in claim 1, formed by a contour sensor comprising a surface sensitive to photon radiation and arranged in the form of strips or a matrix of a CCD or a CID, which surface is incorporated in a housing provided with said transparent window placed in front of the sensitive surface, characterized in that at least said external diopter which marks the separation between said transparent window and the external environment comprises thin anti-reflection interference layers.

3. An image detector as claimed in claim 2, comprising a surface sensitive to visible radiation.

4. An image detector as claimed in claim 3, characterized in that said transparent window is glued to the sensitive surface by means of optical glue.

5. An image detector as claimed in claim 1, characterized in that the transmission coefficient of the photon radiation traversing said transparent medium lies between 0.05 and 0.3.

6. An image detector as claimed in claim 1, characterized in that the external diopter of said transparent window is situated at a distance of between 0.9 and 6 mm from the said sensitive surface.

7. An image detector as claimed in claim 1, characterized in that said optical window is made of photochromic optical glass.

8. An image detector as claimed in claim 1, characterized in that the external diopter of said transparent window is concave so as to transform the said window into a divergent lens.

* * * * *